(12) United States Patent
Rappoport et al.

(10) Patent No.: US 9,713,295 B2
(45) Date of Patent: Jul. 18, 2017

(54) TAPE-BASED GROUNDING STRUCTURES

(75) Inventors: Benjamin M. Rappoport, Los Gatos, CA (US); Amy Qian, San Jose, CA (US); Jiang Ai, Cupertino, CA (US); Jeremy C. Franklin, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 991 days.

(21) Appl. No.: 13/529,635

(22) Filed: Jun. 21, 2012

(65) Prior Publication Data

US 2013/0342495 A1   Dec. 26, 2013

(51) Int. Cl.
*H05K 9/00* (2006.01)
(52) U.S. Cl.
CPC ................... *H05K 9/0054* (2013.01)
(58) Field of Classification Search
CPC ....... G06F 3/041; G06F 3/044; H05K 9/0054; G02F 1/1333; G02F 1/1345
See application file for complete search history.

(56) References Cited

U.S. PATENT DOCUMENTS

| | | | | |
|---|---|---|---|---|
| 6,534,722 B2* | 3/2003 | Takaoka | ......................... | 174/254 |
| 7,892,007 B2 | 2/2011 | Scherer et al. | | |
| 8,279,391 B2 | 10/2012 | Oohira | | |
| 2003/0223249 A1* | 12/2003 | Lee et al. | ....................... | 362/561 |
| 2005/0017620 A1 | 1/2005 | Kim et al. | | |
| 2008/0111943 A1* | 5/2008 | Kim | ................................. | 349/60 |
| 2010/0026927 A1 | 2/2010 | Jee et al. | | |
| 2010/0085326 A1* | 4/2010 | Anno | ...................... | G06F 3/044 |
| | | | | 345/174 |
| 2010/0277663 A1* | 11/2010 | Koo | ................................. | 349/58 |
| 2011/0069036 A1 | 3/2011 | Anno | | |
| 2011/0199554 A1* | 8/2011 | Isami et al. | ...................... | 349/58 |
| 2011/0228490 A1 | 9/2011 | Kim et al. | | |
| 2012/0087065 A1* | 4/2012 | Kim | ....................... | G06F 1/1656 |
| | | | | 361/679.01 |
| 2012/0194393 A1 | 8/2012 | Uttermann et al. | | |
| 2012/0206682 A1 | 8/2012 | Onishi et al. | | |

FOREIGN PATENT DOCUMENTS

WO   WO 2011/151455   * 12/2011

OTHER PUBLICATIONS

3M, "XYZ-Axis Electrically Conductive Tape, Technical Data", 3M, Aug. 2001 (4 pages).

* cited by examiner

*Primary Examiner* — Kenneth Bukowski
(74) *Attorney, Agent, or Firm* — Treyz Law Group, P.C.; G. Victor Treyz; Zachary D. Hadd

(57) ABSTRACT

An electronic device housing may have conductive walls and planar metal internal housing structures. A display in the electronic device may have a touch sensor layer such as an array of capacitive touch sensor electrodes. The display may have display layers in a plastic chassis structure and a metal chassis structure. A display layer may have a conductive surface. Conductive tape may be used to couple the touch sensor to the metal chassis structure and a metal radio-frequency shielding structure. Conductive tape may also be used to short the conductive surface of the display layer to the internal metal housing structure. Segments of conductive tape may run along each of the four edges of a display and may overlap at display corners. Conductive foam structures may be used to short the segments to adjacent portions of the conductive housing walls.

22 Claims, 8 Drawing Sheets

TAPE-BASED GROUNDING STRUCTURES

BACKGROUND

This relates generally to electronic devices and, more particularly, to tape-based grounding structures in electronic devices.

Electronic devices such as computers and cellular telephones have displays, conductive housings, and other conductive structures. It may sometimes be desirable short together conductive electronic device structures. For example, it may be desirable to ground a display to a conductive housing wall to reduce electromagnetic interference.

Conventional grounding structures may consume more volume than desired and may require the use of screws and complex metal structures.

It would therefore be desirable to be able to provide improved conductive structures for electrically coupling structures in an electronic device.

SUMMARY

An electronic device may have a display mounted in a housing. The housing may have conductive walls and internal housing structures such as planar metal structures. Planar internal housing structures may form a mid-plate member having one or more sheet metal structures.

The display may have a conductive touch sensor layer such as an array of capacitive touch sensor electrodes. The display may have display layers such as a color filter layer, a thin-film transistor layer, and polarizer layers. Display layers may be mounted in a display chassis that includes a plastic chassis structure and a metal chassis structure. A display layer may have a conductive surface such as an indium tin oxide surface.

The electronic device may include conductive tape having opposing inner and outer surfaces. The conductive tape may include conductive fibers embedded in adhesive or other structures for providing the conductive tape with three-dimensional conductivity. Conductive tape with three-dimensional conductivity may be used to short the touch sensor to the metal chassis structure and to a metal shielding can associated with an integrated circuit. Conductive tape may also be used to short the conductive surface of the display layer to the internal metal housing structure or other conductive structures within an electronic device.

Segments of conductive tape may run along each of the four edges of a display and may overlap at corners of the display. Foam may be used to short the segments of conductive tape to adjacent portions of the conductive housing walls.

Further features of the invention, its nature and various advantages will be more apparent from the accompanying drawings and the following detailed description of the preferred embodiments.

DETAILED DESCRIPTION

Conductive tape-based grounding structures may be formed from conductive tape that exhibits substantial conductivity in three dimensions. This type of conductive tape may be formed, for example, from conductive fibers embedded in adhesive or from layers of fiber-based conductive structures on the surfaces of a sheet of metal or other carrier (as examples). Conductive tape that exhibits conductivity in three dimensions (i.e., orthogonal dimensions X, Y, and Z) may, if desired, exhibit substantially equal conductivity in each of these three dimensions and may sometimes be referred to as three-dimensionally conductive tape or XYZ-axis electrically conductive tape.

Figure 1:
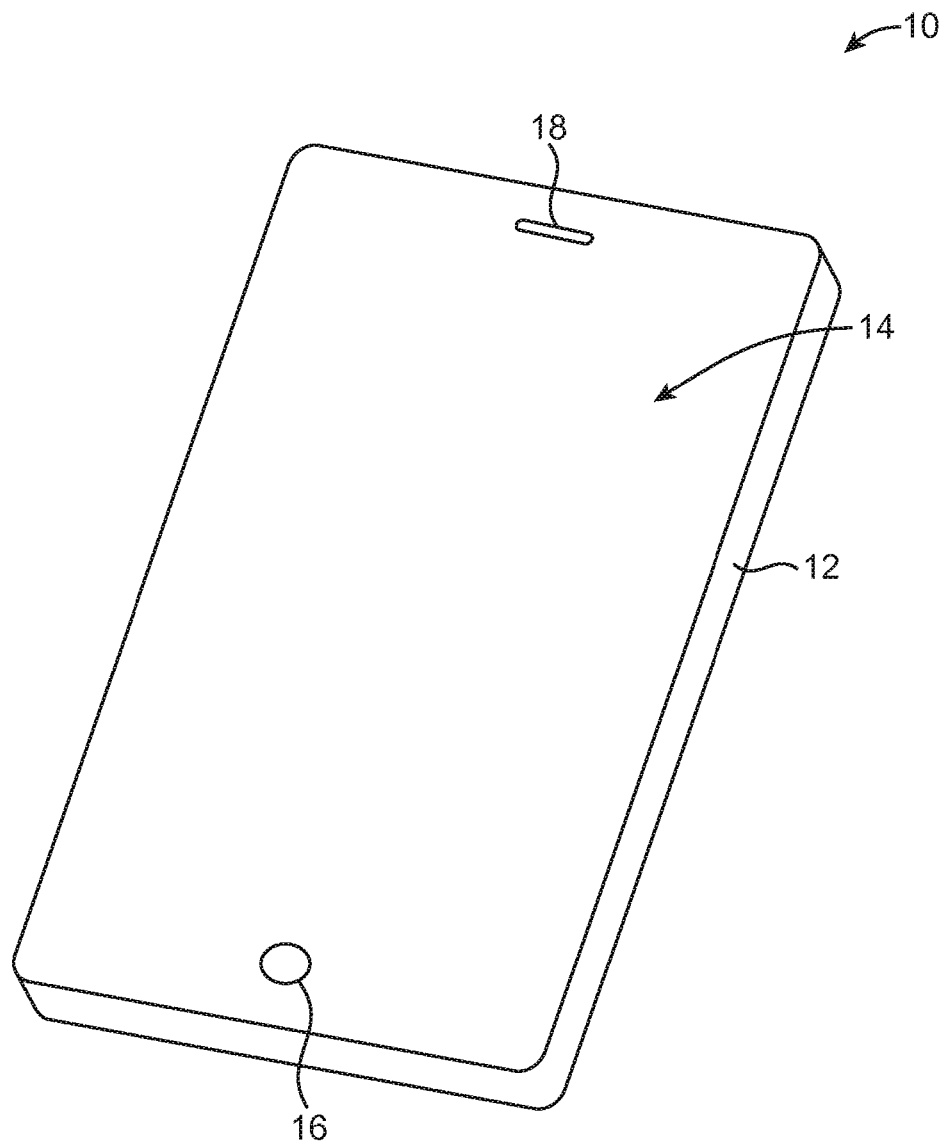
FIG. 1 is a perspective view of an illustrative electronic device with tape-based grounding structures in accordance with an embodiment of the present invention.

An illustrative electronic device of the type that may be provided with a conductive tape structures is shown in FIG. 1. Electronic device 10 may be a computer such as a computer that is integrated into a display such as a computer monitor, a laptop computer, a tablet computer, a somewhat smaller portable device such as a wrist-watch device, pendant device, or other wearable or miniature device, a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. Configurations in which display 14 includes liquid crystal display (LCD) components may sometimes be described herein as an example. This is, however, merely illustrative. Display 14 may include display pixels formed using any suitable type of display technology.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.). The periphery of housing 12 may, if desired, include conductive walls. For example, housing 12 may have a peripheral conductive member such as a metal housing sidewall member that runs around some or all of the periphery of device 10 or a display bezel that surrounds display 14. One or more openings may be formed in housing 12 to accommodate connector ports, buttons, and other components.

Figure 2:
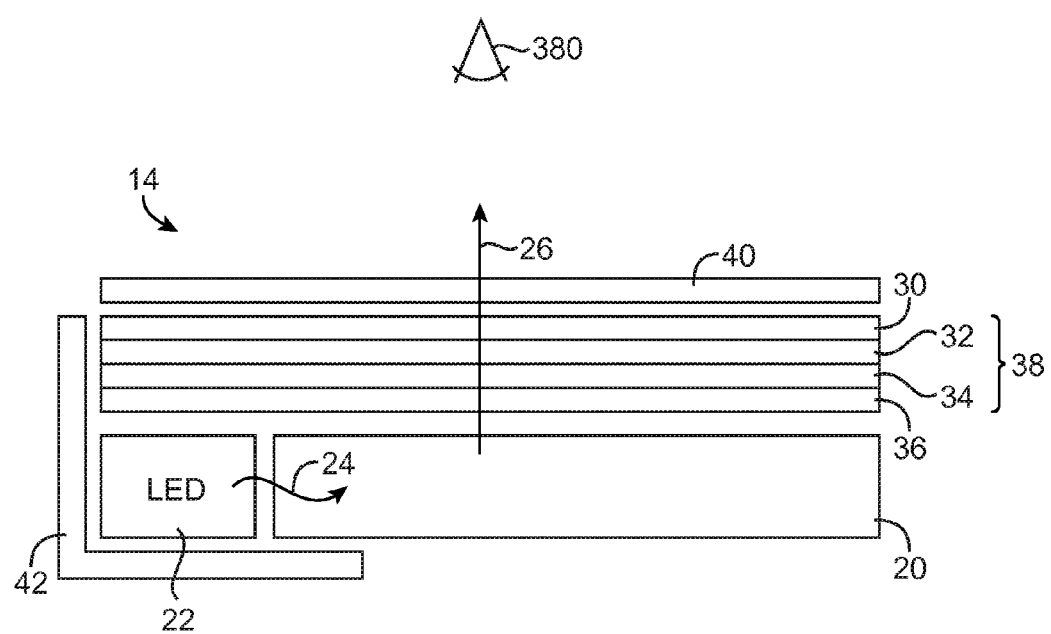
FIG. 2 is a cross-sectional side view of illustrative electronic device display structures in accordance with an embodiment of the present invention.

A cross-sectional side view of electronic device structures associated with display 14 is shown in FIG. 2. As shown in FIG. 2, display 14 may include display backlight structures 20, display structures 38, and optional touch sensor layer 40. Touch sensor layer 40 may be formed from an array of transparent conductive capacitive touch sensor electrodes such as indium tin oxide electrodes. A display cover layer such as a layer of glass or plastic may be used to cover the surface of display 14 (e.g., the front face of device 10 of FIG. 1). The conductive structures of touch sensor layer 40 may be formed on the cover layer, may be formed on a touch sensor substrate such as a layer of glass or plastic, or may be formed on other layers of display 14.

Display backlight structures 20 may include a light guide plate, a reflector, and optical films. The light guide plate may be formed from a rectangular planar layer of plastic. Light 24 that is emitted from light-emitting diode array 22 may be coupled into the light guide plate through the edge of the light guide plate. Light 24 may be distributed laterally throughout display 14 due to the principal of total internal reflection. Light such as light 26 that scatters vertically upwards through backlight structures 20 may pass through display layer 38 (and touch sensor array layer 40) and may serve as backlight that helps a user such as user 380 to view images on display 14. The reflector in backlight structures 20 may be located below the light guide plate and may be used to direct light that has escaped from the light guide plate in the downwards direction back up in upwards direction 26, thereby enhancing backlight efficiency. Optical films such as brightness enhancing films, diffusing films, and other films may be included in backlight structures 20 (e.g., above the light guide plate), if desired.

Display structures 38 may include liquid crystal display structures or structures associated with other suitable types of display. In an illustrative liquid crystal display configuration, a layer of liquid crystal material may be sandwiched between color filter layer 32 and thin-film transistor layer 34. Layer 32 may contain an array of color filter elements for providing display 14 with the ability to display color images for viewer 38. Layer 34 may contain an array of display pixels electrodes. The display pixel electrodes may be used to impose electric fields on portions of the liquid crystal layer, thereby creating an image on display 14. Thin-film transistor circuitry on layer 34 may be used to route control signals from a display driver circuit (e.g., a display driver integrated circuit) to display pixel thin-film transistors and electrodes on layer 34. Layers 32 and 34 may be sandwiched between upper polarizer layer 30 and lower polarizer layer 36.

One or more chassis structures such as chassis structures 42 may be used in forming display 14. Chassis structures 42 may include a plastic chassis structure (sometimes referred to as a p-chassis) and/or a metal chassis structure (sometimes referred to as an m-chassis). These chassis structures may be used in supporting the structures of display 14 such as backlight light source 22, backlight structures 20, and other display layers such as display layers 38.

Device 10 may include radio-frequency transceiver circuitry (e.g., wireless circuitry for transmitting and receiving wireless data), display driver circuitry, processing circuitry, application-specific integrated circuits, clock circuits, and other circuitry. If care is not taken, there is a potential for electromagnetic interference to disrupt the operation of circuits such as these. For example, if a display is not properly grounded, interference from a display driver circuit, display timing circuitry, or other circuitry associated with a display may adversely affect the operation of a sensitive circuit such as a wireless receiver.

To ensure that display structures in device 10 are grounded to conductive housing structures and to ensure that other conductive structures in device 10 are properly shorted to each other to mitigate the effects of potentially harmful electromagnetic interference, device 10 may be provided with tape-based conductive structures. The tape-based conductive structures and associated grounding structures such as conductive foam structures may be used in electrically coupling respective conductive structures within electronic device 10. Tape-based structures such as structures based on three-dimensionally conductive tape may be used, for example, to suppress electromagnetic interference that might otherwise be produced by display structures of the type shown in FIG. 2, thereby helping to ensure that wireless circuitry and other sensitive circuitry in device 10 are not adversely affected.

Figure 3:
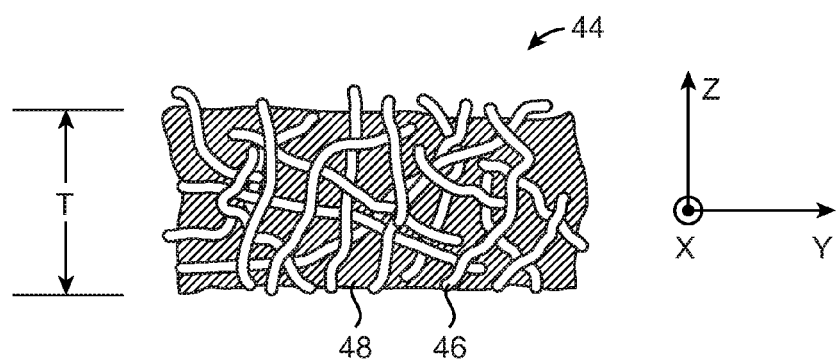
FIG. 3 is a cross-sectional side view of conductive tape that includes adhesive and conductive fibers embedded in the adhesive and that exhibits three-dimensional conductivity in accordance with an embodiment of the present invention.

As shown in the cross-sectional diagram of FIG. 3, conductive tape for tape-based grounding structures in device 10 may be formed from conductive fibers 46 embedded in adhesive 48. Conductive fibers 46 may include metal fibers, dielectric fibers coated with metal, or other conductive fibers. Adhesive 48 may be, for example, pressure sensitive adhesive. Tape 44 may be characterized by a thickness T and a width (in dimension X) and a length (in dimension Y). The thickness T may be relatively small to help accommodate tape 44 in compact portable electronic devices. For example, thickness T may be less than 0.5 mm, less than 0.2 mm, less than 0.1 mm, or less than 0.05 mm (as examples). The length and width of tape 44 may be, for example, in the range of 0-1 mm or more, 1 cm or more, 10 cm or more, or 100 cm or more (as examples). Tape 44 may exhibit three-dimensional conductivity (i.e., tape 44 may be characterized by substantial conductivity and, if desired, substantially equal conductivity, in the X, Y, and Z dimensions).

Figure 4:
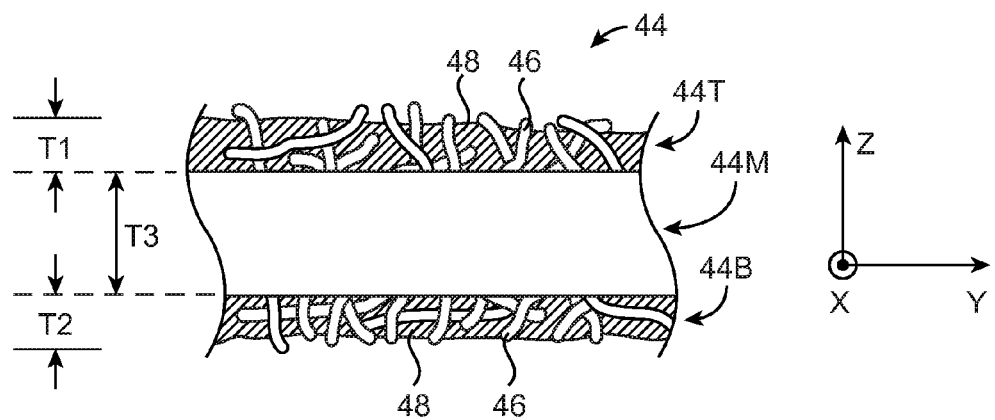
FIG. 4 is a cross-sectional side view of illustrative conductive tape that include layers of conductive fibers embedded in adhesive on opposing sides of a conductive layer such as a metal layer and that exhibits three-dimensional conductivity in accordance with an embodiment of the present invention.

If desired, tape 44 may include a layer of conductor such as metal layer 50 of FIG. 4. In the configuration of FIG. 4, tape 44 includes upper fiber-based conductive layer 44T of thickness T1, metal layer 44M of thickness T3, and lower fiber-based conductive layer 44M of thickness T2. The values of T1, T2, and T3 may be less than 0.5 mm, less than 0.2 mm, less than 0.1 mm, or less than 0.05 mm (as examples). Layers 44T and 44B may include conductive fibers 46 embedded in pressure sensitive adhesive 48. Layer 44M may be formed from a sheet of copper, gold, or other metals (as an example).

Using tape structures such as the illustrative structures used in forming tape 44 of FIGS. 3 and 4, tape 44 may exhibit significant conductivity in three orthogonal dimensions: dimension X, dimension Y, and dimension Z. Because tape 44 such as tape 44 of FIGS. 3 and 4 is conductive in three dimensions, tape 44 may sometimes be referred to as XYZ tape or as tape that exhibits three-dimensional conductivity.

Figure 5:
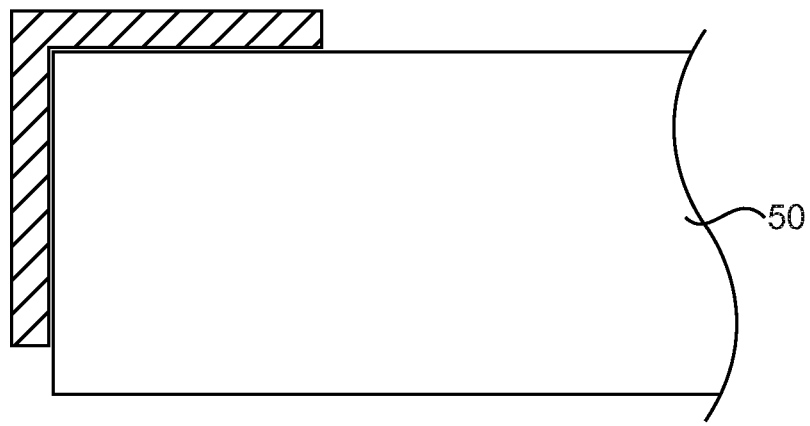
FIG. 5 is a cross-sectional side view of an electronic device structure that has been wrapped with an L-shaped tape-based grounding structure in accordance with an embodiment of the present invention.
Figure 6:
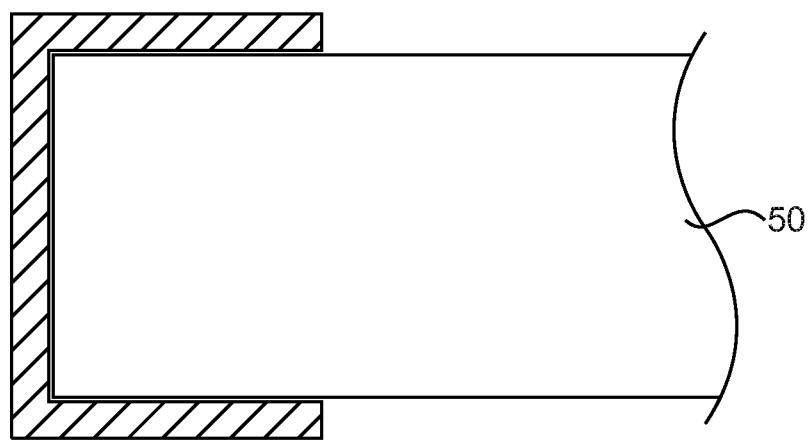
FIG. 6 is a cross-sectional side view of an electronic device structure that has been wrapped with a C-shaped tape-based grounding structure in accordance with an embodiment of the present invention.

Tape 44 may be wrapped around the edges of display structures and other structures in device 10. As an example, tape 44 may be used in forming a C-shaped edge wrap about structures 50 of FIG. 5 or an L-shaped edge wrap about structures 50 of FIG. 6. If desired, tape 44 may be wrapped about device structures to form other cross sectional shapes. The illustrative L shape of FIG. 5 and the illustrative C shape of FIG. 6 are provided as examples. Structures 50 may include housing structures and internal device components and may include conductive structures in device 10 such as display structures 14. Examples of conductive structures that may be wrapped with tape 44 and that may be shorted to tape 44 include display structures (e.g., a conductive touch sensor layer, a conductive m-chassis structure, etc.), conductive housing structures, and other conductive structures in device 10.

Figure 7:
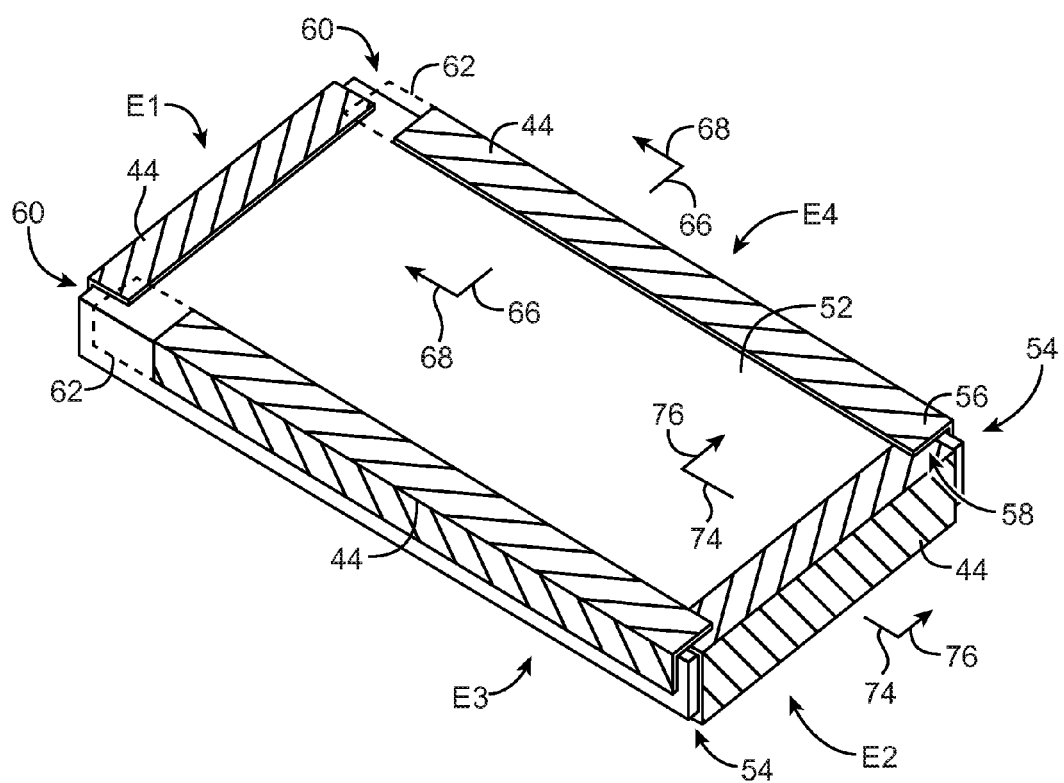
FIG. 7 is a perspective view of an illustrative device structure such as a display that has been wrapped on four peripheral edges with C-shaped and L-shaped tape-based grounding structures in accordance with an embodiment of the present invention.

FIG. 7 is a perspective view of illustrative structures 52 having wrapped tape 44 for forming conductive tape-based electrical shorting structures (e.g., conductive tape-based grounding structures). Structures 52 may be, for example, device structures such as device structures 50 of FIGS. 5 and 6. For example, structures 52 may be display structures such as some or all of the structures in display 14 of FIG. 4 (e.g., a display module). Structures 52 may include conductive layers such as a conductive touch sensor layer, a conductive coating such as an indium tin oxide layer on a color filter layer or other display layer, a conductive m-chassis structure, a p-chassis structure, and other display structures. Conductive materials in structures 52 may be shorted to each other and to other conductive structures in device 10. For example, conductive tape 44 may be used to ground conductive materials in structures 52 to each other and to conductive housing structures and other conductive device structures to reduce the susceptibility of device 10 to electromagnetic interference.

Structures 52 may have a rectangular outline with four edges E1, E2, E3, and E4 (as an example). Tape 44 may be wrapped around structures 52. As shown in FIG. 7, tape 44 may extend along each of the four edges of structures 52. Wrapped tape on structures 52 may be formed from a single piece of tape 44 or from two or more segments of tape 44. In the example of FIG. 7, a segment of tape 44 having an L-shaped cross section has been formed along edge E1 and a segment of tape 44 having a C-shaped cross section has been formed along opposing edge E2. Edges E1 and E2 may be associated with the opposing ends of an elongated rectangular display or other structures 52. L-shaped segments of tape 44 may be formed along opposing edges E3 and E4 (e.g., side edges). Other combinations of L-shaped tape segments, C-shaped tape segments, and tape structures with other configurations may be used. The configuration of FIG. 7 is merely illustrative.

Portions of tape 44 of FIG. 7 may overlap. For example, portions of tape 44 may overlap in corners such as corners 54. As an example, portion 56 of tape 44 along edge E4 may overlap and electrically connect to portion 58 of tape 44 along edge E2. Tape 44 may also overlap in corners 60, as indicated by dashed lines 62 or, if desired, corners 60 may be free of overlapping tape 44. When tape 44 overlaps in all four corners of rectangular display structures (e.g., structures 52 of FIG. 7), tape 44 may help surround and ground structures 52 without the need for an m-chassis that completely surrounds display structures 52. The elimination of metal associated with forming a complete rectangular ring-shaped m-chassis for display structures 52 by using four segments of tape 44 may help minimize device size for device 10.

Figure 8:
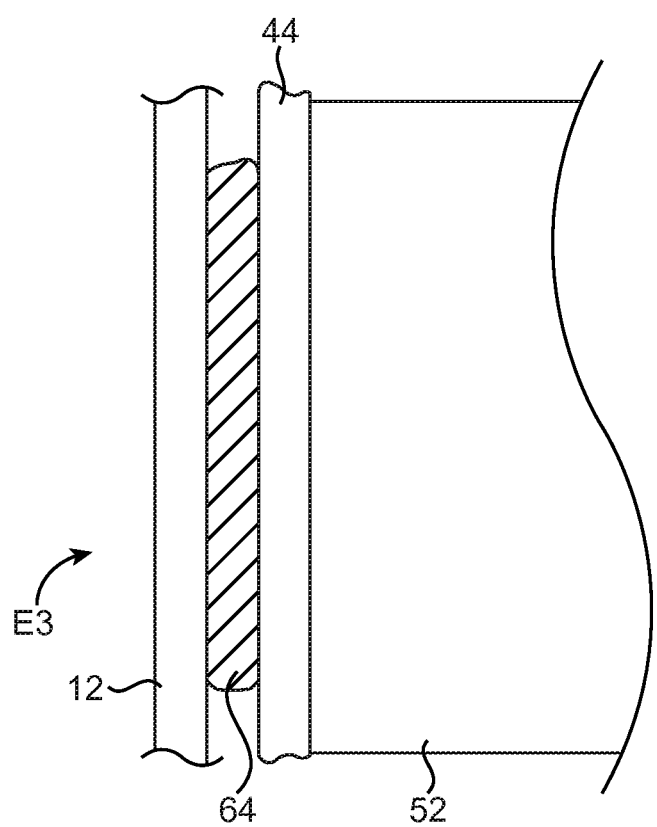
FIG. 8 is a top view of an interior portion of an electronic device in which tape-based grounding structures have been used to ground display structures to a conductive housing in accordance with an embodiment of the present invention.

FIG. 8 is a top view of structures 52 along an edge (e.g., edge E3) of structures 52 of FIG. 7 when installed in device 10. As shown in FIG. 8, conductive foam 64 and tape 44 may be used in electrically connecting structures 52 to housing 12. Housing 12 may be, for example, a conductive wall of housing 12 of device 10 in FIG. 1 (e.g., a metal sidewall). Conductive foam 64 may be a gasket formed from foam covered with a conductive fabric or may be other conductive grounding structures. Foam structures such as conductive foam 64 of FIG. 8 may be used along one or more of the edges of structures 52. For example, the four edges of a display may be shorted to four corresponding edges of a conductive metal housing such as housing 12 using segments of tape 44 and corresponding foam members 64 or foam members 64 may be used only on the left and right edges of device 10 (as examples).

Figure 9:
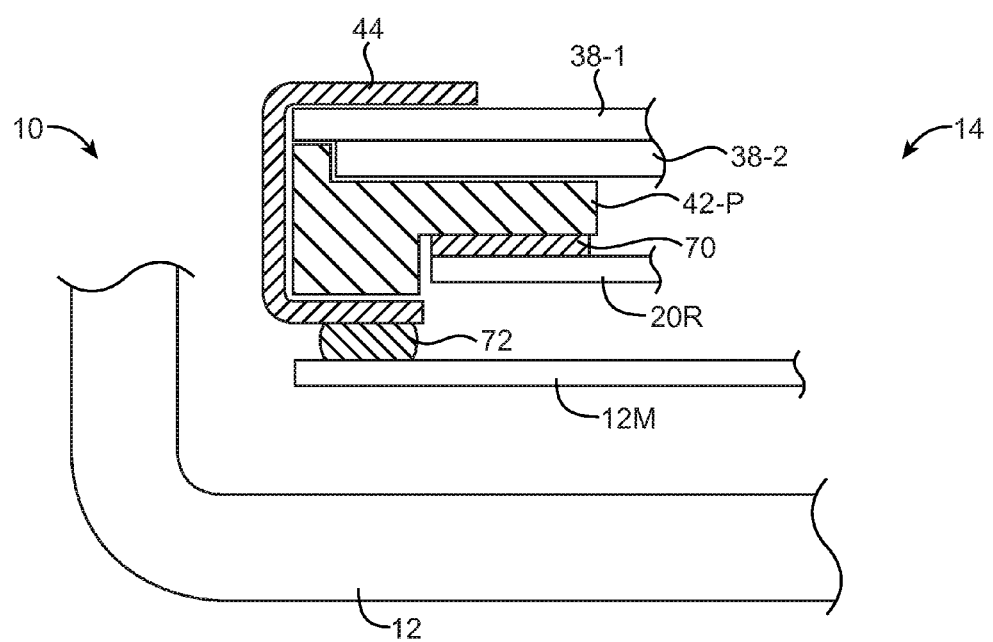
FIG. 9 is a cross-sectional side view of an edge portion of illustrative electronic device with display structures and tape-based grounding structures in accordance with the present invention.

FIG. 9 is a cross-sectional view of a portion of electronic device 10 showing how the structures of display 14 may be wrapped using tape 44. The cross-sectional side view of FIG. 9 is taken along lines 66 of FIG. 7 and is viewed in direction 68. As shown in FIG. 9, housing 12 may include an internal housing structure such as metal member 12M. Metal member 12M may be formed from one or more metal structures such as stainless steel sheet metal structures. Member 12M may have a planar shape and may sometimes be referred to as a mid-plate member. Housing structure 12M may be shorted to conductive tape 44 using pressure sensitive adhesive 72 (e.g., conductive pressure sensitive adhesive). Pressure sensitive adhesive 72 may be separate from tape 44 or may form part of tape 44 (see, e.g., adhesive 48 of FIGS. 3 and 4). Conductive tape 44 may be wrapped around an edge of display 14 (e.g., using a C-shaped wrap).

Display 14 may include a plastic chassis structure such as p-chassis 42P. Display structures such as display layers 38-1 and 38-2 may be mounted on p-chassis structure 42P. Display layers in display 14 such as illustrative layers 38-1 and 38-2 may include a color filter layer, a thin-film transistor layer, polarizer layers, and a touch sensor layer (as examples). As an example, upper layer 38-1 may be a color filter layer having a conductive coating layer such as a blanket layer of indium tin oxide (ITO). The conductive surface of layer 38-1 may be shorted to conductive tape 44. Conductive tape 44 can ground display layer 38-1 to conductive housing structure 12M using conductive pressure sensitive adhesive 72. Conductive adhesive 72 may be separate from tape 44 or may be part of the adhesive in which conductive tape fibers 46 is embedded such as adhesive 48 of FIGS. 3 and 4.

Display 14 may include backlight structures 20 such as reflector 20R. Reflector 20R may be formed from a metal coating on a sheet of plastic or a reflective plastic coating on a sheet of plastic (as examples). Reflector 29R may be attached to p-chassis 42P using pressure sensitive adhesive 70.

As shown in FIG. 9, the conductive outer surface of display layer 38-1 may be shorted to the inner surface of tape 44 that is facing the conductive outer surface of display layer 38-1, whereas the opposing outer surface of tape 44 that is facing internal metal housing structure 12M may be shorted to the internal metal housing structure 12M (e.g., through conductive adhesive structure 72). Because tape 44 may exhibit three-dimensional conductivity, tape 44 may form an electrical pathway between display layer 38-1 and internal housing structure 12M that passes through tape 44 from one side to the other (e.g., from the inner surface of tape 44 to the outer surface of tape 44).

Figure 10:
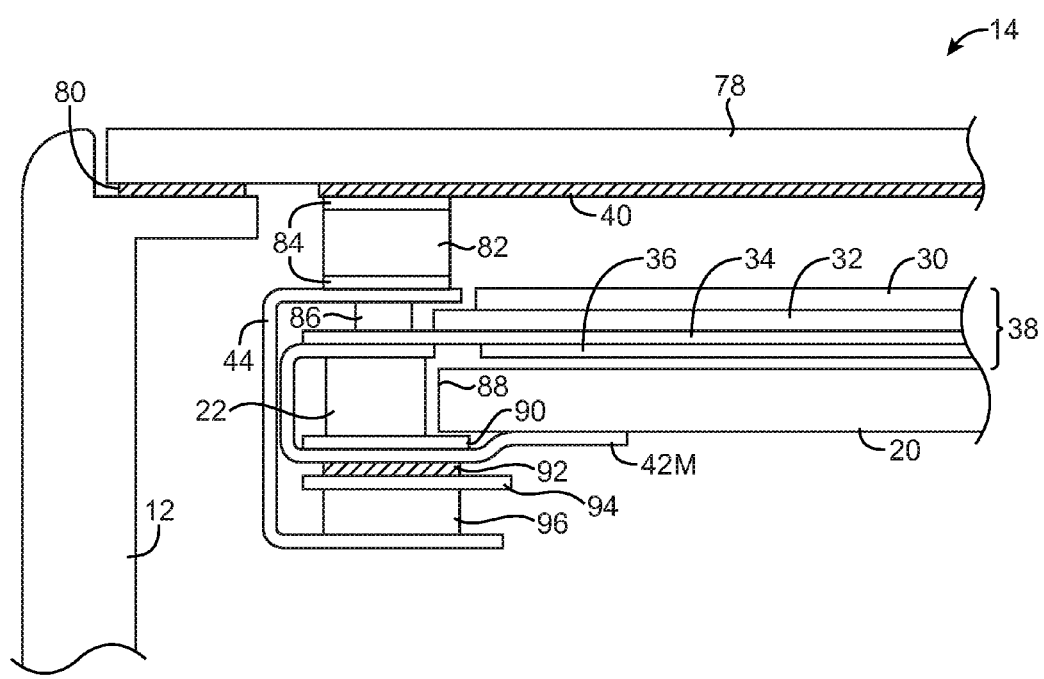
FIG. 10 is a cross-sectional side view of another edge portion of an illustrative electronic device with display structures and tape-based grounding structures in accordance with the present invention.

FIG. 10 is a cross-sectional view of display structures 52 of FIG. 7 taken along lines 74 of FIG. 7 and viewed in direction 76 and associated portions of device 10. As shown in FIG. 10, display 14 of device 10 may include a cover layer such as display cover layer 78. Display cover layer 78 may be formed from a layer of clear glass, a transparent plastic sheet, or other clear structure. Display cover layer 78 may be mounted to housing 12 using adhesive 80.

The underside of display cover layer 78 may be covered with a conductive touch sensor layer such as an array of indium tin oxide capacitive touch sensor electrodes (touch sensor array 40). Touch sensor layer 40 may be formed from structures that are deposited on cover layer 78 (i.e., that use cover layer 78 as a substrate) and/or separate substrate layers (e.g., a flexible substrate layer such as a sheet of polyimide). Other configurations may be used for implementing touch sensor capabilities in device 10, if desired. The configuration of FIG. 10 in which touch sensor layer 40 is mounted adjacent to the underside of display cover layer 98 is merely illustrative.

As shown in FIG. 10, tape 44 may have an outer surface that faces the underside of cover layer 78 and touch sensor layer 40. Tape 44 may be attached directly to touch sensor layer 40 or touch sensor layer 40 may be shorted to tape 44 using conductive foam 82 (e.g., a layer of foam covered with conductive fabric). Foam 82 may be attached between tape 44 and touch sensor array layer 40 using adhesive 84 (e.g., conductive adhesive). Adhesive 84 may be separate from tape 44 or may be part of the adhesive in which conductive fibers 46 of tape 44 are embedded (i.e., adhesive 48 of FIGS. 3 and 4). Display driver integrated circuit 86 may be mounted on thin-film transistor layer 34 in display layers 38. Color filter layer 32 may be mounted above thin-film transistor layer 34. A layer of liquid crystal material may be interposed between layers 32 and 34. Layers 32 and 34 may be sandwiched between polarizer layers 30 and 36.

Light-emitting diode array 22 may be used to emit backlight into edge 88 of the light guide plate in backlight structures 20. Backlight structures 20 may be mounted to m-chassis 42M. M-chassis 42M may be attached to p-chassis 42P of FIG. 9 (e.g., by injection molding p-chassis 42P over M-chassis 42M at the corners of device 10).

Light-emitting diode array 22 may be mounted on a substrate such as substrate 90. Substrate 90 may be formed from a rigid printed circuit board material (e.g., fiberglass-filled epoxy material such as FR4) or a flexible printed circuit substrate material such as polyimide or a sheet of other flexible polymer. Substrate 90 may be mounted on m-chassis structures 42M.

Pressure sensitive adhesive 92 may be used to mount printed circuit 94 (e.g., a rigid or flexible printed circuit) to m-chassis 42M. A display timing integrated circuit for supporting the operation of display 14 may be mounted to printed circuit 94 within conductive radio-frequency shielding structure 96. Shielding structure 96 may be a rectangular metal shielding can that is grounded to traces on printed circuit 94. Conductive tape 44 may be used in electrically coupling (grounding) touch sensor layer 40 to ground structures in device 10 (e.g., housing walls 12, m-chassis 42M, shielding can 96, and, if desired, mid-plate 12M or other metal housing structures).

As shown in FIG. 10, touch sensor layer 40 may be shorted to the outer surface of tape 44 that faces layer 40 under foam 82, whereas the inner surface of tape 44 may be shorted to the vertical portion of m-chassis 42M that is facing the inner surface of tape 44. The inner surface of tape 44 may also have a portion that faces the lower surface of shielding can 96, so that tape 44 may be shorted to the lower surface of shielding can 96. Because tape 44 may exhibit three-dimensional conductivity, tape 44 may form an electrical pathway between touch sensor layer 40 and m-chassis 42M (and between layer 40 and shielding structure 96) that involves signal paths between the opposing inner and outer surfaces of tape 44.

The foregoing is merely illustrative of the principles of this invention and various modifications can be made by those skilled in the art without departing from the scope and spirit of the invention. The foregoing embodiments may be implemented individually or in any combination.

What is claimed is:

1. Apparatus, comprising:
a display having a rectangular perimeter with four edges and four corners and having a conductive layer;
a metal internal electronic device housing structure;
conductive tape that has first and second opposing surfaces and that exhibits three-dimensional conductivity such that the tape comprises an electrical pathway that extends from the first surface to the second surface and that electrically connects the conductive layer to the metal internal electronic device housing structure, wherein the conductive tape extends along a first edge of the display; and
additional conductive tape that extends along a second edge of the display that is substantially orthogonal to the first edge, wherein the conductive tape overlaps and is electrically shorted to the additional conductive tape.

2. The apparatus defined in claim 1 wherein the conductive tape has opposing inner and outer surfaces, wherein the inner surface is attached to the conductive layer and wherein the outer surface is coupled to the metal internal electronic device housing structure.

3. The apparatus defined in claim 2 wherein the metal internal electronic device housing structure comprises a sheet metal structure.

4. The apparatus defined in claim 2 wherein the metal internal electronic device housing structure comprises a planar housing member formed of at least one sheet metal structure and wherein the outer surface is electrically connected to the planar housing member.

5. The apparatus defined in claim 1 wherein the display comprises a plastic chassis structure and wherein the conductive tape is wrapped around the plastic chassis structure.

6. The apparatus defined in claim 1 wherein the display comprises a metal chassis structure, the apparatus further comprising:
- a display cover layer; and
- a touch sensor layer on the display cover layer, wherein the additional conductive tape exhibits three-dimensional conductivity and electrically connects the touch sensor layer to the metal chassis structure.

7. The apparatus defined in claim 6 further comprising a metal shielding can, wherein the additional conductive tape has an outer surface that faces the touch sensor layer and that is coupled to the touch sensor layer and has an inner surface that faces the metal shielding can and that is coupled to the metal shielding can.

8. The apparatus defined in claim 7 further comprising conductive foam that electrically connects the touch sensor layer to the outer surface of the additional conductive tape.

9. The apparatus defined in claim 6 wherein the display comprises a color filter layer and a thin-film transistor layer, wherein the conductive layer is formed on the color filter layer such that the color filter layer is interposed between the conductive layer and the thin-film transistor layer, and wherein the conductive layer is interposed between the touch sensor layer and the color filter layer.

10. The apparatus defined in claim 1 wherein the conductive layer comprises a layer of indium tin oxide.

11. The apparatus defined in claim 1 wherein conductive tape segments cover each of the four edges of the display, wherein the conductive tape segments include the conductive tape and the additional conductive tape, and wherein each of the conductive tape segments is formed from conductive tape material that exhibits three-dimensional conductivity.

12. The apparatus defined in claim 11 wherein the conductive tape-overlaps the additional conductive tape at one of the four corners of the display.

13. The apparatus defined in claim 11 further comprising:
- a metal electronic device housing wall; and
- at least one strip of conductive foam that extends between at least one of the conductive tape segments along at least one of the edges and the metal electronic device housing wall.

14. An electronic device, comprising:
- a display having a touch sensor layer and having a metal chassis structure; and
- conductive tape that exhibits three-dimensional conductivity and that has opposing outer and inner surfaces, wherein the outer surface of the conductive tape faces the touch sensor layer and is electrically coupled to the touch sensor layer, wherein the inner surface of the conductive tape faces the metal chassis structure and is electrically coupled to the metal chassis structure such that the touch sensor layer is shorted to the metal chassis structure through the conductive tape, and wherein the conductive tape has a substantially C-shaped cross-sectional profile.

15. The electronic device defined in claim 14 further comprising a housing having at least one internal planar metal structure, the electronic device further comprising: additional conductive tape that exhibits three-dimensional conductivity, wherein the additional conductive tape has an outer surface that faces the internal planar metal structure and that is electrically coupled to the internal sheet metal structure.

16. The electronic device defined in claim 15 wherein the display comprises display layers including at least one layer with an indium tin oxide surface and wherein the additional conductive tape has an inner layer that is connected to the indium tin oxide layer.

17. The electronic device defined in claim 16 wherein the at least one layer comprises a color filter layer and the display layers include a thin-film transistor layer interposed between the color filter layer and the metal chassis structure, and wherein the indium tin oxide surface is interposed between the touch sensor layer and the color filter layer.

18. The electronic device defined in claim 14 further comprising a printed circuit to which a metal radio-frequency shielding structure is mounted, wherein the inner surface of the conductive tape faces the metal radio-frequency shielding structure and is connected to the metal radio-frequency shielding structure.

19. An electronic device, comprising:
- a metal housing including at least one internal planar metal structure;
- a display having first and second opposing surfaces, wherein the display comprises a layer with a conductive surface; and
- conductive tape that exhibits three-dimensional conductivity and that has a first portion with an inner surface that faces and is connected to the conductive surface and that has a second portion with an opposing outer surface that faces and is coupled to the internal planar metal structure, wherein the conductive tape wraps around the display from the first surface to the second surface such that the first and second portions of the conductive tape overlap and the second portion is interposed between the first portion and the internal planar metal structure, and wherein the first and second opposing surfaces are substantially parallel.

20. The electronic device defined in claim 19 wherein the display includes metal chassis structures, the electronic device further comprising:
- a touch sensor layer; and
- a conductive tape structure that electrically grounds the touch sensor layer to the metal chassis structures.

21. The electronic device defined in claim 20 wherein the display comprises:
- a thin-film transistor layer on the metal chassis structures; and
- a display driver integrated circuit mounted to the thin-film transistor layer, wherein the layer with the conductive surface comprises a color filter layer.

22. The electronic device defined in claim 21 wherein the conductive surface comprises a layer of transparent conductive material coated on a surface of the color filter layer, and wherein the layer of transparent conductive material is interposed between the touch sensor layer and the color filter layer.

* * * * *